US012588442B2

(12) United States Patent
Zheng et al.

(10) Patent No.: US 12,588,442 B2
(45) Date of Patent: Mar. 24, 2026

(54) METHOD FOR FABRICATING MULTIPLE WORK FUNCTION LAYERS

(71) Applicant: Shanghai Huali Integrated Circuit Corporation, Shanghai (CN)

(72) Inventors: Hongzhu Zheng, Shanghai (CN); Jian Wang, Shanghai (CN); Yunqing Dai, Shanghai (CN); Wenzhan Zhou, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 518 days.

(21) Appl. No.: 18/355,369

(22) Filed: Jul. 19, 2023

(65) Prior Publication Data

US 2024/0170279 A1    May 23, 2024

(30) Foreign Application Priority Data

Nov. 22, 2022    (CN) .......................... 202211473665.5

(51) Int. Cl.
| | |
|---|---|
| *H01L 21/02* | (2006.01) |
| *H10D 84/01* | (2025.01) |
| *H10D 84/03* | (2025.01) |
| *H10D 84/85* | (2025.01) |

(52) U.S. Cl.
CPC .... *H01L 21/02186* (2013.01); *H01L 21/0228* (2013.01); *H10D 84/0193* (2025.01); *H10D 84/038* (2025.01); *H10D 84/85* (2025.01)

(58) Field of Classification Search
None
See application file for complete search history.

(56) References Cited

U.S. PATENT DOCUMENTS

| | | | |
|---|---|---|---|
| 2021/0134794 A1* | 5/2021 | Huang | ................. H10D 30/031 |
| 2021/0249517 A1* | 8/2021 | Cheng | .................... H10D 30/43 |

* cited by examiner

*Primary Examiner* — Xiaoming Liu
(74) *Attorney, Agent, or Firm* — Banner & Witcoff, Ltd.

(57) ABSTRACT

The present application provides a method for fabricating multiple work function layers, including: forming the first to the nth transistor gates with notches; forming a blocking layer in the notches; depositing the first work function layer and removing the first work function layer on the first to the (n−1)th transistor gates; depositing a second work function layer; removing the second work function layer on the first to the (n−2)th transistor gates; depositing a third work function layer on the blocking layer on the first to the (n−2)th transistor gates and the second work function layer on the (n−1)th and nth transistor gates; removing the third work function layer on the first to (n−3)th transistor gates; depositing the third to the (n−1)th work function layers by analogy until only the blocking layer exists on the last transistor gate, herein the thickness of the third to the (n−1)th work function layers decreases sequentially and gradually.

13 Claims, 3 Drawing Sheets

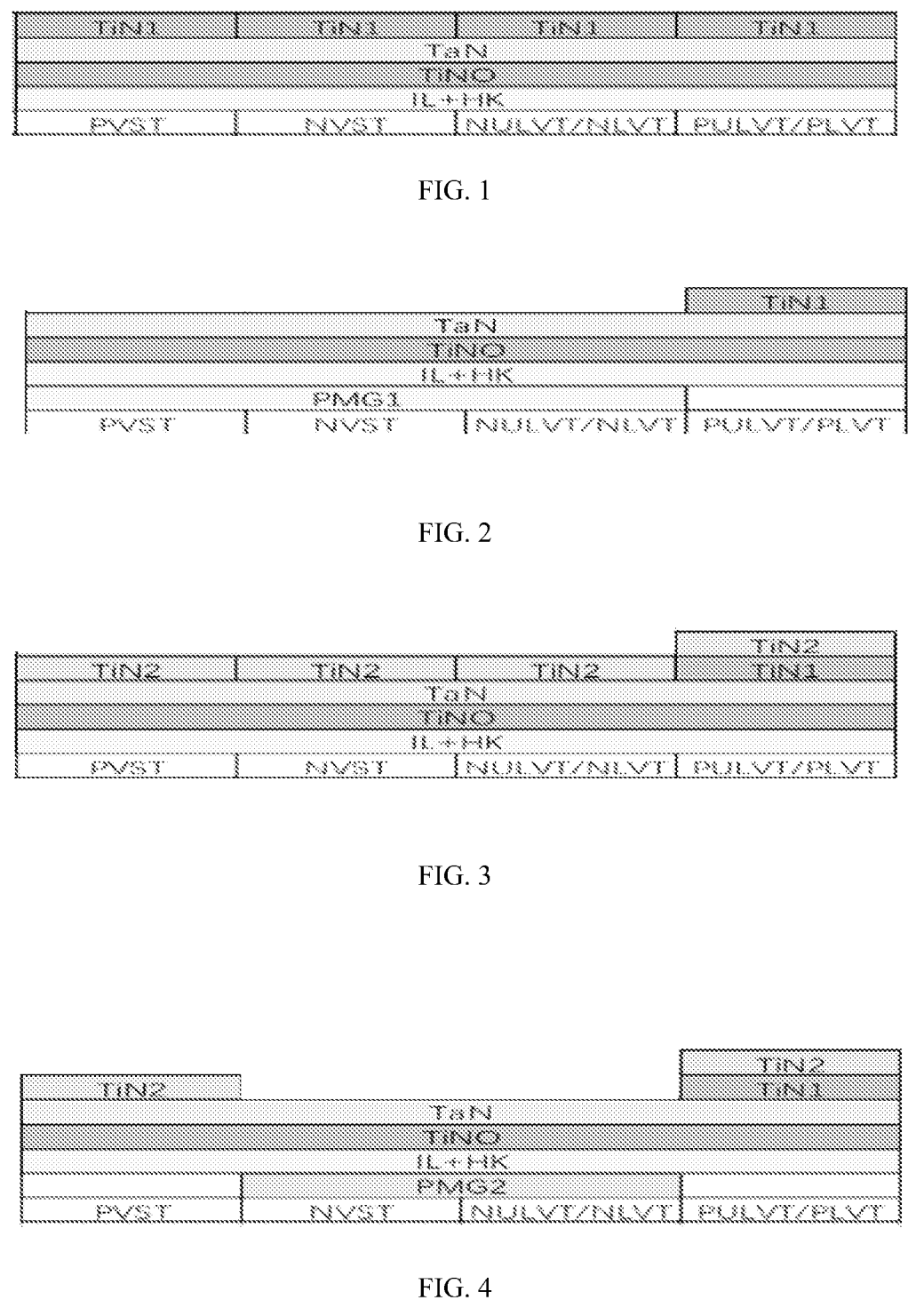

| TiN1 | TiN1 | TiN1 | TiN1 |
|---|---|---|---|
| TaN | | | |
| TiNO | | | |
| IL+HK | | | |
| PVST | NVST | NULVT/NLVT | PULVT/PLVT |

FIG. 1

| | | | TiN1 |
|---|---|---|---|
| TaN | | | |
| TiNO | | | |
| IL+HK | | | |
| PMG1 | | | |
| PVST | NVST | NULVT/NLVT | PULVT/PLVT |

FIG. 2

| | | | TiN2 |
|---|---|---|---|
| TiN2 | TiN2 | TiN2 | TiN1 |
| TaN | | | |
| TiNO | | | |
| IL+HK | | | |
| PVST | NVST | NULVT/NLVT | PULVT/PLVT |

FIG. 3

| | | | TiN2 |
|---|---|---|---|
| TiN2 | | | TiN1 |
| TaN | | | |
| TiNO | | | |
| IL+HK | | | |
| PMG2 | | | |
| PVST | NVST | NULVT/NLVT | PULVT/PLVT |

FIG. 4

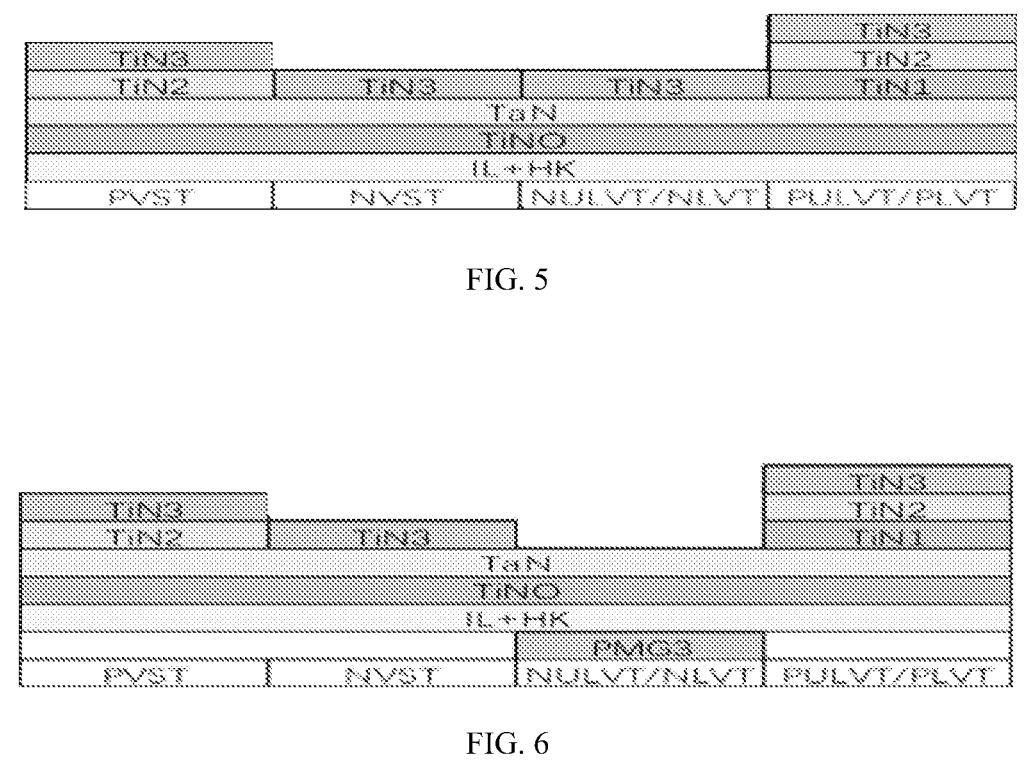

| TiN3 | | | TiN3 |
| TiN2 | TiN3 | TiN3 | TiN2 |
| | | | TiN1 |
| TaN | | | |
| TiNO | | | |
| IL+HK | | | |
| PVST | NVST | NULVT/NLVT | PULVT/PLVT |

FIG. 5

| TiN3 | | | TiN3 |
| TiN2 | TiN3 | | TiN2 |
| | | | TiN1 |
| TaN | | | |
| TiNO | | | |
| IL+HK | | | |
| | | PMG3 | |
| PVST | NVST | NULVT/NLVT | PULVT/PLVT |

FIG. 6

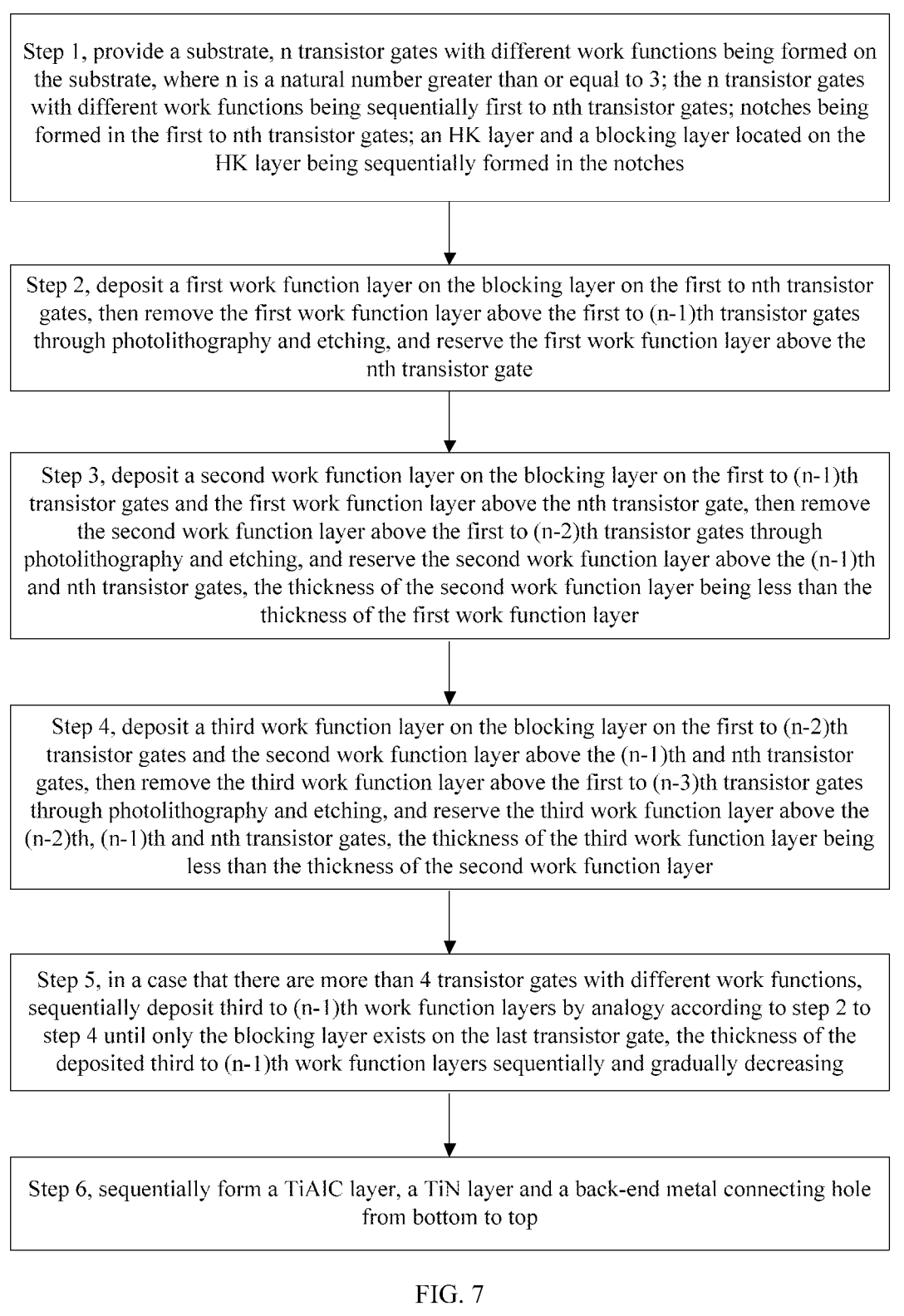

Step 1, provide a substrate, n transistor gates with different work functions being formed on the substrate, where n is a natural number greater than or equal to 3; the n transistor gates with different work functions being sequentially first to nth transistor gates; notches being formed in the first to nth transistor gates; an HK layer and a blocking layer located on the HK layer being sequentially formed in the notches Step 2, deposit a first work function layer on the blocking layer on the first to nth transistor gates, then remove the first work function layer above the first to (n-1)th transistor gates through photolithography and etching, and reserve the first work function layer above the nth transistor gate Step 3, deposit a second work function layer on the blocking layer on the first to (n-1)th transistor gates and the first work function layer above the nth transistor gate, then remove the second work function layer above the first to (n-2)th transistor gates through photolithography and etching, and reserve the second work function layer above the (n-1)th and nth transistor gates, the thickness of the second work function layer being less than the thickness of the first work function layer Step 4, deposit a third work function layer on the blocking layer on the first to (n-2)th transistor gates and the second work function layer above the (n-1)th and nth transistor gates, then remove the third work function layer above the first to (n-3)th transistor gates through photolithography and etching, and reserve the third work function layer above the (n-2)th, (n-1)th and nth transistor gates, the thickness of the third work function layer being less than the thickness of the second work function layer Step 5, in a case that there are more than 4 transistor gates with different work functions, sequentially deposit third to (n-1)th work function layers by analogy according to step 2 to step 4 until only the blocking layer exists on the last transistor gate, the thickness of the deposited third to (n-1)th work function layers sequentially and gradually decreasing Step 6, sequentially form a TiAlC layer, a TiN layer and a back-end metal connecting hole from bottom to top

FIG. 7

METHOD FOR FABRICATING MULTIPLE WORK FUNCTION LAYERS

CROSS-REFERENCES TO RELATED APPLICATIONS

This application claims priority to Chinese patent application No. CN 202211473665.5, filed on Nov. 22, 2022 at CNIPA, and entitled "METHOD FOR FABRICATING MULTIPLE WORK FUNCTION LAYERS", the disclosure of which is incorporated herein by reference in entirety.

TECHNICAL FIELD

The present application relates to the field of semiconductor technology, in particular, to a method for fabricating multiple work function layers.

BACKGROUND

When the semiconductor process node enters less than 14 nm, the fabrication of transistor gates with multiple work function layers has become one of the necessary choices. Defects in the existing technology for fabricating transistor gates with multiple work function layers easily lead to damages to materials of certain multiple function layers, ultimately resulting in electrical drift and yield loss. For example, a method for forming transistor gates with multiple (for example in the case of four) different work functions (MWF) in the existing technology includes the following steps: providing a substrate on which a p-channel Field-Effect Transistor (pFET) and an n-channel Field-Effect Transistor (nFET) are formed, the pFET and the nFET each having notches formed therein; forming a high-k layer and a blocking layer in each notch; forming four or more TiN layers with different thicknesses through atomic layer deposition (ALD) to achieve transistor gates with different work functions. Specifically, it includes: 1) first, depositing a thick titanium nitride (TiN1) layer, defining and opening an area to be removed through a first-layer PMG1 mask, protecting other areas with a photoresist (PR) and a bottom anti-reflective coating (BARC), and removing the TiN1 layer in the opened area through etching; 2) depositing a TiN2 layer thinner than TiN1, then defining and opening an area to be removed through a second-layer PMG2 mask, protecting other areas with a PR layer and BARC, and removing the opened up area through etching; 3) forming the thin TiN3 layer, defining and opening an area to be removed through a second-layer PMG3 mask, protecting other areas through the PR and BARC, removing the opened up area through etching, and finally, removing the PR and BARC further to form the four TiN layers with different thicknesses.

This process uses etching in step 2) which is stronger than step 1) when removing the TiN layer, causing etchant liquid enter the device area along the junction resulting slight damage to the surface of the TiN layer; the etching during the removal of the TiN layer in step 3) is the strongest etch in the three steps, causing serious damage to the TiN layer in the junction area of the device, and ultimately influencing the electrical properties of the product seriously.

BRIEF SUMMARY

The present application provides a method for fabricating multiple work function layers for FET transistors, avoiding the problem of severe damages to the device area at the transistor junction caused by etchant liquid during etching of the TiN layers in the existing technology.

The present application provides a method for fabricating multiple work function layers, at least including:

step 1: providing a substrate, n transistor gates with different work functions being formed on the substrate, where n is a natural number greater than or equal to 3; the n transistor gates with different work functions being sequentially first the nth transistor gates; notches being formed in the first the nth transistor gates; an high-κ dielectric constant (HK) layer and a blocking layer located on the HK layer being sequentially formed in the notches;

step 2: depositing a first work function layer on the blocking layer on the first to the n-th transistor gates, then removing the first work function layer above the first to the (n−1)th transistor gates through photolithography and etching, and reserving the first work function layer above the nth transistor gate;

step 3: depositing a second work function layer on the blocking layer on the first the (n−1)th transistor gates and the first work function layer above the nth transistor gate, then removing the second work function layer above the first to the (n−2)th transistor gates through photolithography and etching, and reserving the second work function layer above the (n−1)th and the nth transistor gates, herein the thickness of the second work function layer is less than the thickness of the first work function layer;

step 4: depositing a third work function layer on the blocking layer on the first to the (n−2)th transistor gates and the second work function layer above the (n−1)th and the nth transistor gates, then removing the third work function layer above the first to the (n−3)th transistor gates through photolithography and etching, and reserving the third work function layer above the (n−2)th, the (n−1)th and the nth transistor gates, herein the thickness of the third work function layer is less than the thickness of the second work function layer;

step 5: in a case that there are more than 4 transistor gates with different work functions, sequentially depositing third the (n−1)th work function layers by analogy according to step 2 to step 4 until only the blocking layer exists on the last transistor gate, the thickness of the deposited third the (n−1)th work function layers sequentially and gradually decreasing; and step 6: sequentially forming a TiAlC layer, a TiN layer and a back-end metal connecting hole from bottom to top.

Exemplarily, in step 1, the n transistors with different work functions include pFET and nFET.

Exemplarily, in step 1, the blocking layer is a TiNO layer and a TaN layer located on the TiNO layer.

Exemplarily, in step 2, a method for removing the first work function layer above the first the (n−1)th transistor gates through photolithography and etching, and reserving the first work function layer above the nth transistor gate includes: spin-coating a photoresist on the first work function layer; then exposing the first work function layer above the first to the (n−1)th transistor gates through exposure and development by using a first mask; finally removing the exposed first work function layer through etching, while the first work function layer above the nth transistor gate is not etched because of using the photoresist as the blocking layer.

Exemplarily, in step 2, a method for depositing the first work function layer is atomic layer deposition (ALD).

Exemplarily, in step 3, a method for depositing the second work function layer is atomic layer deposition (ALD).

Exemplarily, in step 1, the n transistors with different work functions are four transistors with different work functions, and the four transistors gates with different work functions are sequentially first to fourth transistor gates; notches are formed in all of the first to fourth transistor gates; an HK layer and a blocking layer located on the HK layer are sequentially formed in the notches.

Exemplarily, in step 2, a first work function layer is deposited on the blocking layer on the first to fourth transistor gates, then the first work function layer above the first to third transistor gates is removed through photolithography and etching, and the first work function layer above the fourth transistor gate is reserved.

Exemplarily, in step 3, a second work function layer is deposited on the blocking layer on the first to third transistor gates and the first work function layer above the fourth transistor gate, then the second work function layer above the first and second transistor gates is removed through photolithography and etching, and the second work function layer above the third and fourth transistor gates is reserved; herein the thickness of the second work function layer is less than the thickness of the first work function layer.

Exemplarily, in step 4, a third work function layer is deposited on the blocking layer on the first and second transistor gates and the second work function layer above the third and fourth transistor gates, then the third work function layer above the first transistor gate is removed through photolithography and etching, and the third work function layer above the second, third and fourth transistor gates is reserved; herein the thickness of the third work function layer is less than the thickness of the second work function layer.

Exemplarily, in step 2, the first work function layer is a TiN layer and the thickness of the first work function layer is about 23 angstroms.

Exemplarily, in step 3, the second work function layer is the TIN layer and the thickness of the second work function layer is about 13 angstroms.

Exemplarily, in step 4, the third work function layer is the TiN layer and the thickness of the third work function layer is about 10 angstroms.

As described above, the method for preparing multiple work function layers according to the present application has the following beneficial effects: in the method, in a case that n (n is a natural number>=3) transistor gates with different work functions need to be formed, the TiN (or other similar functional materials) layer to be deposited has (n–1) layers with different thicknesses (TK), and the deposition order is defined as from thick to thin (TKn–1>TKn–2> . . . >TK1), all unnecessary areas are removed at each time of removal of TiN (or other similar functional materials), and the etching amount of the subsequent removal of TiN (or other similar functional materials) is smaller than that of the previous one to prevent damage to the TIN (or other similar functional materials) layer formed in the previous step caused by the excessive etching of the TiN (or other similar functional materials) layer in the subsequent etching step.

BRIEF DESCRIPTION OF THE DRAWINGS

FIG. 1 illustrates a schematic of transistor gates covered by a first work function layer in the present application.

FIG. 2 illustrates a s schematic of a device after a first work function layer above the first to the third transistor gates is removed in the present application.

FIG. 3 illustrates a schematic of a device after a second work function layer is deposited on a blocking layer on first to third transistor gates and a first work function layer above a fourth transistor gate in the present application.

FIG. 4 illustrates a schematic of a device after a second work function layer above first and second transistor gates is removed in the present application.

FIG. 5 illustrates a schematic of a device after a third work function layer is deposited on a blocking layer on first and second transistor gates and a second work function layer above third and fourth transistor gates in the present application.

FIG. 6 illustrates a schematic of a device after a third work function layer above a first transistor gate is removed in the present application.

FIG. 7 illustrates a flowchart of a method for fabricating multiple work function layers in the present application.

DETAILED DESCRIPTION OF THE APPLICATION

The embodiments of the present application will be described below through specific embodiments. Those skilled in the art can easily understand the other advantages and effects of the present application from the content disclosed in the description. The present application may also be implemented or applied through different specific embodiments. The details in the description may also be modified or changed based on different perspectives and applications without departing from the spirit of the present application.

Please refer to FIG. 1 to FIG. 7. It is to be understood that the illustrations provided in the embodiments only schematically describe the basic concept of the present application, the drawings only illustrate the components related to the present application and are not drawn according to the actual number, shape, and size of the components during implementation, the type, quantity and scale of each component during actual implementation may be freely changed, and the component layout may be more complex.

The present application provides a method for fabricating multiple work function layers. Referring to FIG. 7, it illustrates a flowchart of a method for fabricating multiple work function layers in the present application. The method at least includes the following steps:

In step 1, a substrate is provided. n transistor gates with different work functions are formed on the substrate, where n is a natural number greater than or equal to 3. The n transistor gates with different work functions are sequentially first the nth transistor gates. Notches are formed in the first the nth transistor gates. An HK layer and a blocking layer located on the HK layer are sequentially formed in the notches.

Further, in the present application, in step 1 of this embodiment, the n transistors with different work functions include pFET and nFET.

Further, in the present application, in step 1 of this embodiment, the blocking layer is a titanium-oxynitride (TiNO) layer and a TaN layer located on the TiNO layer.

Further, in the present application, in step 1 of this embodiment, the n transistors with different work functions are four transistors with different work functions, and the four transistors gates with different work functions are sequentially first to fourth transistor gates; notches are formed in all of the first to fourth transistor gates; an HK layer and a blocking layer located on the HK layer are sequentially formed in the notches. Refer to FIG. 1 to FIG.

6. FIG. 1 illustrates a schematic of transistor gates covered by a first work function layer in the present application. The last line in FIG. 1 to FIG. 6 represents device types, the device on the left of each last line represents device, and the last line represents four different device types, namely PVST, NVST, NULVT/NLVT, and PULVT/PLVT.

In step 1, n transistor gates with different work functions are formed on the substrate, where n is a natural number greater than or equal to 3. The n transistor gates with different work functions are sequentially first to the nth transistor gates. Notches are formed in the first to the nth transistor gates. An interlayer high K dielectric(ILD+HK) layer and a blocking layer located on the HK layer are sequentially formed in the notches. In step 1 of this embodiment, the n transistors with different work functions include pFET and nFET. In step 1 of this embodiment, the blocking layer is a TiNO layer and a tantalum nitride (TaN) layer located on the TiNO layer. In step 1 of this embodiment, the n transistors with different work functions are four transistors with different work functions. The four transistors gates with different work functions are sequentially first to fourth transistor gates. Notches are formed in all of the first to fourth transistor gates. An HK layer and a blocking layer located on the HK layer are sequentially formed in the notches.

In step 2, a first work function layer is deposited on the blocking layer on the first the nth transistor gates, then the first work function layer above the first to the (n−1)th transistor gates is removed through photolithography and etching, and the first work function layer above the nth transistor gate is reserved.

Further, in the present application, in step 2 of this embodiment, a method for removing the first work function layer above the first to the (n−1)th transistor gates through photolithography and etching, and reserving the first work function layer above the nth transistor gate includes: spin-coating a photoresist on the first work function layer; then exposing the first work function layer above the first to the (n−1)th transistor gates through exposure and development by using a first mask; finally removing the exposed first work function layer through etching, while the first work function layer above the nth transistor gate is not etched because of using the photoresist as the blocking layer. In other embodiments, a bottom anti-reflective coating may also be used as the blocking layer to prevent the first work function layer from being etched.

Further, in the present application, in step 2 of this embodiment, a method for depositing the first work function layer is atomic layer deposition.

Further, in the present application, in step 2 of this embodiment, a first work function layer is deposited on the blocking layer on the first to fourth transistor gates, then the first work function layer above the first to third transistor gates is removed through photolithography and etching, and the first work function layer above the fourth transistor gate is reserved. In step 1 of this embodiment, the etching adopts DHF for about 20 seconds and $SC_2$ for 80 seconds.

Further, in the present application, in step 2 of this embodiment, the first work function layer is TiN and the thickness of the first work function layer is 23 angstroms.

Referring to FIG. 2, it illustrates a schematic of a device after the first work function layer above the first to third transistor gates is removed in the present application. In step 2, a method for removing the first work function layer above the first the (n−1)th transistor gates through photolithography and etching, and reserving the first work function layer above the nth transistor gate includes: spin-coating a photoresist on the first work function layer; then exposing the first work function layer above the first to the (n−1)th transistor gates through exposure and development by using a first mask; finally removing the exposed first work function layer through etching, while the first work function layer above the nth transistor gate is not etched because of using the photoresist as the blocking layer. In step 2 of this embodiment, a method for depositing the first work function layer is atomic layer deposition. In step 2 of this embodiment, a first work function layer is deposited on the blocking layer on the first to fourth transistor gates, then the first work function layer above the first to third transistor gates (PVST, NVST and NULVT/NLVT) is removed through photolithography and etching, and the first work function layer (TiN1) above the fourth transistor gate (PULVT/PLVT) is reserved. In step 2 of this embodiment, the first work function layer is TiN and the thickness of the first work function layer is about 23 angstroms.

In step 3, a second work function layer is deposited on the blocking layer on the first the (n−1)th transistor gates and the first work function layer above the nth transistor, then the second work function layer above the first to the (n−2)th transistor gates is removed through photolithography and etching, and the second work function layer above the (n−1)th and nth transistor gates is reserved. The thickness of the second work function layer is less than the thickness of the first work function layer.

Referring to FIG. 3, it illustrates a schematic of a device after a second work function layer is deposited on a blocking layer on first to third transistor gates and a first work function layer above a fourth transistor gate in the present application.

Further, in the present application, in step 3 of this embodiment, a second work function layer (TiN2) is deposited on the blocking layer on the first to third transistor gates and the first work function layer above the fourth transistor gate. Referring to FIG. 4, it illustrates illustrates a schematic of a device after a second work function layer above first and second transistor gates is removed in the present application.

In step 3, the second work function layer above the first and second transistor gates (NVST and NULVT/NLVT) is removed through photolithography (using a mask PMG2) and etching, and the second work function layer above the third transistor gate (PVST) and fourth transistor gate (PULVT/PLVT) is reserved. The thickness of the second work function layer is less than the thickness of the first work function layer.

Further, in the present application, in step 3 of this embodiment, a method for depositing the second work function layer is atomic layer deposition.

Further, in the present application, in step 3 of this embodiment, the second work function layer is TiN and the thickness of the second work function layer is about 13 angstroms.

In step 4, a third work function layer is deposited on the blocking layer on the first to the (n−2)th transistor gates and the second work function layer above the (n−1)th and nth transistor gates, then the third work function layer above the first to the (n−3)th transistor gates is removed through photolithography and etching, and the third work function layer above the (n−2)th, (n−1)th and nth transistor gates is reserved. The thickness of the third work function layer is less than the thickness of the second work function layer.

Referring to FIG. 5, it illustrates a schematic of a device after the third work function layer is deposited on the blocking layer on first and second transistor gates and the second work function layer above the third and fourth transistor gates in the present application.

Further, in the present application, in step 4 of this embodiment, a third work function layer (TiN3) is deposited on the blocking layer on the first and second transistor gates (NVST and NULVT/NLVT) and the second work function layer above the third transistor gate (PVST) and the fourth transistor gate (PULVT/PLVT).

Referring to FIG. 6, it illustrates a schematic of a device after the third work function layer above the first transistor gate is removed in the present application. In step 4, the third work function layer (TiN3) above the first transistor gate (NULVT/NLVT) is removed through photolithography (using a mask PMG3) and etching, and the third work function layer above the second, third and fourth transistor gates is reserved. The thickness of the third work function layer is less than the thickness of the second work function layer. NVST in FIG. 1 to FIG. 6 represents the second transistor gate.

Further, in the present application, in step 4 of this embodiment, the third work function layer is TiN and the thickness of the third work function layer is about 10 angstroms.

In step 5, in a case that there are more than 4 transistor gates with different work functions, third to the (n−1)th work function layers are sequentially deposited by analogy according to step 2 to step 4 until only the blocking layer exists on the last transistor gate. The thickness of the deposited third the (n−1)th work function layers sequentially and gradually decreases. In other words, in a case that n transistor gates with different work functions (n is a natural number>=3), the TiN (or other similar functional materials) layer to be deposited is defined as n−1 layers with different thicknesses (TK), the deposition order is defined as from thick to thin (TKn−1>TKn−2> . . . >TK1), all unnecessary areas are removed at each time of removal of TiN (or other similar functional materials), and the etching amount of the subsequent removal of TiN (or other similar functional materials) is smaller than that of the previous one to prevent damage to the TiN (or other similar functional materials) layer formed in the previous step caused by the excessive etching of the TIN (or other similar functional materials) layer in the subsequent etching step. That is, in a case that there are more than 4 transistor gates with different work functions, the methods for depositing a TiN layer and etching to remove the TIN layer are sequentially executed according to step 2 to step 4, but the value of n changes. In a case that there are only four transistor gates, step 6 may be directly executed.

In step 6, a titanium carbonic-alumina (TiAlC) layer, a TiN layer and a back-end metal connecting hole are sequentially formed from bottom to top.

As described above, in the method according to the present application, in a case that n (n is a natural number>=3) transistor gates with different work functions need to be formed, the TiN (or other similar functional materials) layer to be deposited is defined as n−1 layers with different thicknesses (TK), and the deposition order is defined as from thick to thin (TKn−1>TKn−2> . . . >TK1), all unnecessary areas are removed at each time of removal of TiN (or other similar functional materials), and the etching amount of the subsequent removal of TiN (or other similar functional materials) is smaller than that of the previous one to prevent damage to the TiN (or other similar functional materials) layer formed in the previous step caused by the excessive etching of the TiN (or other similar functional materials) layer in the subsequent etching step. Therefore, the present application overcomes various disadvantages in the existing technology and thus has a great industrial utilization value.

The above embodiments are only intended for exemplarily describing the principle and effect of the present application, instead of limiting the present application. Those skilled in the art may modify or change the above embodiments without departing from the spirit and scope of the present application. Therefore, all equivalent modifications or changes made by those skilled in the art without departing from the spirit and technical concept disclosed in the present application shall still be covered by the claims of the present application.

What is claimed is:

1. A method for fabricating multiple work function layers, at least comprising:

step 1: providing a substrate, forming n transistor gates from a first to an nth transistor gates on the substrate, wherein each of the n transistor gates comprises a different work function from each other, where n is a natural number greater than or equal to 3; forming notches in the first to the nth transistor gates; and forming an HK layer and a blocking layer sequentially on the HK layer in the notches;

step 2: depositing a first work function layer on the blocking layer on the first to the nth transistor gates, removing the first work function layer from above the first to the (n−1)th transistor gates through a first process of photolithography and etching, wherein the first process reserves the first work function layer above the nth transistor gate;

step 3: depositing a second work function layer on the blocking layer and on the first to the (n−1)th transistor gates and the first work function layer above the nth transistor gate, removing the second work function layer from above the first to the (n−2)th transistor gates through a second process of photolithography and etching, wherein the second process reserves the second work function layer above the (n−1)th and nth transistor gates, wherein a thickness of the second work function layer is less than a thickness of the first work function layer;

step 4: depositing a third work function layer on the blocking layer, the first to the (n−2)th transistor gates and the second work function layer above the (n−1)th and the nth transistor gates, removing the third work function layer from above the first to (n−3)th transistor gates through a third process of photolithography and etching, wherein the third process reserves the third work function layer above the (n−2)th, (n−1)th and nth transistor gates, wherein a thickness of the third work function layer is less than the thickness of the second work function layer;

step 5: in a case that there are more than 4 transistor gates, wherein each of which has a different work function from each other, depositing a third to (n−1)th work function layers sequentially by analogy according to step 2 to step 4 until only the blocking layer exists on a last transistor gate, wherein thicknesses of the deposited third to the (n−1)th work function layers decrease sequentially and gradually; and step 6: sequentially forming a TiAlC layer, a TiN layer, and a back-end metal connecting hole from bottom to top.

2. The method for fabricating the multiple work function layers according to claim 1, wherein in step 1, the n transistors having different work functions comprise pFET and nFET.

3. The method for fabricating the multiple work function layers according to claim 1, wherein in step 1, the blocking layer comprises a TiNO layer and a TaN layer disposed on the TiNO layer.

4. The method for fabricating the multiple work function layers according to claim 1, wherein in step 2, removing the first work function layer from above the first to the (n–1)th transistor gates through a fourth process of photolithography and etching, and reserving the first work function layer above the nth transistor gate comprises: spin-coating a photoresist on the first work function layer, exposing and developing the first work function layer above the first to the (n–1)th transistor gates with a first mask, and finally removing the exposed first work function layer through etching, wherein the first work function layer above the nth transistor gate is not etched under protection of the first mask layer on the photoresist.

5. The method for fabricating the multiple work function layers according to claim 1, wherein in step 2, depositing the first work function layer is via atomic layer deposition.

6. The method for fabricating the multiple work function layers according to claim 1, wherein in step 3, depositing the second work function layer is via atomic layer deposition.

7. The method for fabricating the multiple work function layers according to claim 1, wherein in step 1, the n transistors with different work functions comprise from a first transistor gate to a fourth transistor gate, wherein notches are formed in all of the four transistor gates, and wherein an high dielectric constant (HK) layer and a blocking layer disposed on the HK layer are sequentially formed in the notches.

8. The method for fabricating the multiple work function layers according to claim 7, wherein step 2 further comprises depositing a first work function layer on the blocking layer and the first to fourth transistor gates, and removing the first work function layer from above the first to third transistor gates through a fifth process of photolithography and etching, wherein the fifth process reserves the first work function layer above the fourth transistor gate.

9. The method for fabricating the multiple work function layers according to claim 8, wherein step 3 further comprises depositing a second work function layer on the blocking layer, the first to third transistor gates, and the first work function layer above the fourth transistor gate, and removing the second work function layer above the first and second transistor gates through a sixth process of photolithography and etching, and wherein the sixth process reserves the second work function layer above the third and fourth transistor gates, wherein a thickness of the second work function layer is less than the thickness of the first work function layer.

10. The method for fabricating the multiple work function layers according to claim 9, wherein step 4 further comprises depositing a third work function layer on the blocking layer, the first and second transistor gates, and the second work function layer above the third and fourth transistor gates, and removing the third work function layer from above the first transistor gate through a seventh process of photolithography and etching, wherein the seventh process reserves the third work function layer above the second, third and fourth transistor gates, wherein a thickness of the third work function layer is less than the thickness of the second work function layer.

11. The method for fabricating the multiple work function layers according to claim 7, wherein in step 2, the first work function layer comprises a TiN layer, and wherein the thickness of the first work function layer is about 23 angstroms.

12. The method for fabricating the multiple work function layers according to claim 7, wherein in step 3, the second work function layer comprises a TiN layer, and wherein the thickness of the second work function layer is about 13 angstroms.

13. The method for fabricating the multiple work function layers according to claim 7, wherein in step 4, the third work function layer comprises a TiN layer, and wherein the thickness of the third work function layer is about 10 angstroms.

\* \* \* \* \*